United States Patent [19]

Hinrichs

[11] 4,349,693

[45] Sep. 14, 1982

[54] APPARATUS FOR SEALING AN ELECTRICAL COMPONENT

[75] Inventor: Fritz Hinrichs, Wolfratshausen, Fed. Rep. of Germany

[73] Assignee: Siemens Aktiengesellschaft, Berlin & Munich, Fed. Rep. of Germany

[21] Appl. No.: 275,697

[22] Filed: Jun. 22, 1981

[30] Foreign Application Priority Data

Jul. 11, 1980 [DE] Fed. Rep. of Germany ....... 3026371

[51] Int. Cl.³ .............................................. H05K 5/06
[52] U.S. Cl. ........................... 174/52 PE; 264/272.11
[58] Field of Search ......................... 174/52 PE, 52 S; 264/261, 262, 263, 272.11, 273; 335/202; 249/110

[56] References Cited

U.S. PATENT DOCUMENTS 4,246,437 1/1981 Frey et al. ..................... 174/52 PE

FOREIGN PATENT DOCUMENTS 7821508 10/1978 Fed. Rep. of Germany .

Primary Examiner—B. A. Reynolds
Assistant Examiner—D. A. Tone
Attorney, Agent, or Firm—Hill, Van Santen, Steadman, Chiara & Simpson

[57] ABSTRACT

A method and apparatus for sealing an electrical component in a housing surrounding the component employs a system of capillary channels in the housing through which sealing resin is conducted from a dispensing point to completely close and seal any housing gaps. A reliable sealing and closing of different housing joints is achieved by connecting only those housing joints of identical or similar capillary characteristics to a particular dispensing point via channels. A number of different dispensing points each associated with a particular group of housing gaps to be sealed are thus provided and different resins or variations of a same resin may be individually supplied to each dispensing point. The dispensing points and associated capillary channels may be contoured and profiled in order to best facilitate resin flow therein in order to insure a complete sealing of the housing.

7 Claims, 5 Drawing Figures

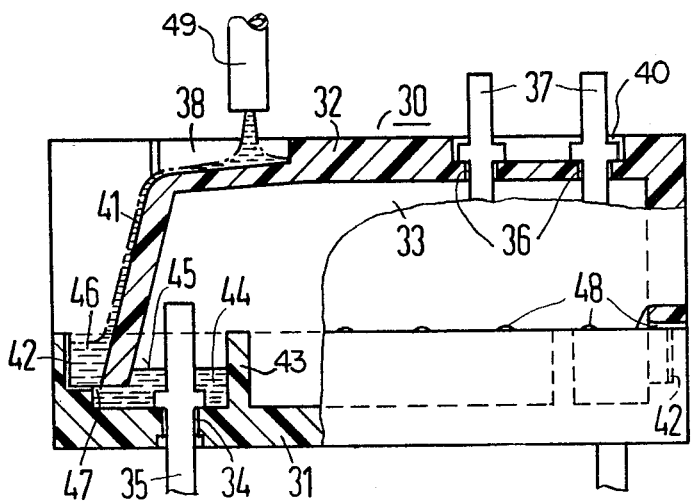
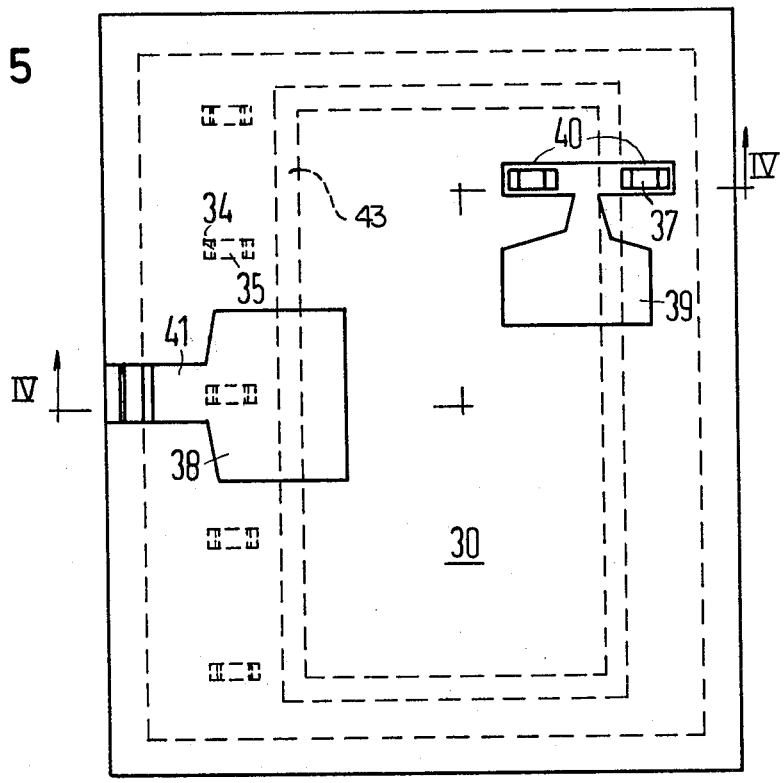

APPARATUS FOR SEALING AN ELECTRICAL COMPONENT

BACKGROUND OF THE INVENTION

1. Field of the Invention

The present invention relates to a housing and method of sealing same for an electrical component and in particular to such a housing and method which make use of the capillary action of channels in the housing to draw sealing compound to close and seal all housing gaps.

2. Description of the Prior Art

Many electrical components such as, for example, relays are contained in a housing consisting of a base and a cap with the base having a number of openings therein for receiving various contacts. In order to insure a hermetic seal of the component, all gaps and contact openings in the housing are sealed with a sealing compound, such as a suitable resin. It is known to introduce the sealing compound via a dispensing point in the base or through wider filling channels so that the sealing compound is conveyed to the housing joints which are to be sealed by means of the capillary action of the channel system. Such a structure and method of sealing electronic components in a housing are known, for example, for German utility patent No. 7,821,508 and United Kingdom Pat. No. 2009532 A.

In conventional structures and methods, all of the points which are to be sealed are supplied with sealing compound from a common reservoir or are connected to one another at least via the channel system or a network of channels. In known structures this network of channels exhibits additional cross connections in order to achieve a good distribution of the sealing compound. This method and apparatus for sealing a housing is adequate if all of the capillary gaps and channels which are to be sealed from a single dispensing point are identical, however, the supply of all of the capillary network from a single dispensing point does not provide an adequate seal if, because of specific construction necessities and/or tolerances, different sized joints are to be sealed in a single component. A similar disadvantage results if the flow paths between the dispensing point and the joints which are to be sealed are of vastly different lengths or if the viscosity of the sealing compound is not optimally adapted to the various capillaries. Additionally, fluctuations in the viscosity of the sealing compound which may be caused, for example, by changes in the temperature, have a similarly unfavorable influence on the overall seal which is achieved. The above factors can cause an ineffective seal for the reason that the capillary action of the joints or gaps is greatly dependent upon the geometric shapes thereof, that is, upon the length of the joints, and is also dependent upon the viscosity of the resin. Differences in either of these characteristics can result in widely differing suction or capillary forces within different capillary networks. This in turn results in the fact that the casting compound is drawn in greater volume into narrow gaps and, because of the common sealing compound supply via the channel network in conventional structures, the sealing compound may even be drawn out of the wider gaps which have initially been closed and filled with sealing compound as a result of an initial uniform distribution.

The above problem cannot always be solved by simply supplying additional sealing compound because the excess sealing compound will not necessarily remain in the gaps with a low capillary action but will more likely be drawn into the gaps of high capillary action which are already filled to excess. When the volume of sealing compound in such gaps exceeds the volume of the gap such as, for example, as a result of the additionally occurring gravitational force, the sealing compound may flow into the interior of the housing which must be avoided at all costs.

SUMMARY OF THE INVENTION

It is an object of the present invention to provide an apparatus and method for sealing an electrical component in a housing which permits introduction of the sealing compound in such a manner that even housing gaps having geometric dimensions which differ substantially from one another can be reliably sealed by such sealing compound.

The above object is inventively achieved in a method and apparatus which employ at least two dispensing points which are independent and separate from one another and are disposed in locations such that only capillary gaps of approximately equal capillary force are connected to a common dispensing point.

The distribution and assignment of various capillary networks and gaps to a plurality of separate dispensing points allows sealing points of similar sealing characteristics and capillary characteristics to be combined. This insures that the sealing takes place as uniformly as possible and that all housing joints are supplied with sealing compound. At the same time the advantages of conventional channel systems, that is the separation of the filling point and the sealing opint, is retained. Thus, in the application of the present invention to, for example, sealing a relay, it is possible to supply the joint between a base plate and a protective cap with sealing compound independently of the sealing of the contact terminals for the relay. Furthermore, it is preferable to connect terminal pin ducts having different sizes and shapes to separate dispensing points. It is also preferable, in those cases wherein a large number of similarly shaped ducts or channels are present, to provide a plurality of separate dispensing points because the distance of the capillary gap which is to be sealed from the dispensing point influences the capillary action, as described above. In this manner the necessary amount of sealing compound can be determined relatively accurately for each dispensing point, and the suction of this sealing compound out of one capillary gap into another gap is substantially eliminated.

In a further embodiment of the invention the flowing action of the sealing compound within the dispensing points and channels can be influenced by, for example, a slope of the dispensing point or in the capillary channel. The flowing action can also be improved and controlled by the use of different cross-sectional profiles of the channels, that is, different contours and sizes within the capillary channels themselves. In this manner it is insured that, for example, a large quantity of the sealing compound may be conducted from a dispensing point into a capillary channel which has to supply more points which are to be sealed than other capillary channels.

It is generally preferable to provide the capillary channels for distributing the sealing compound on the outer surface of the housing wall which is to be sealed such as, for example, on the base plate of a relay. Depending upon the construction, however, it may be advantageous for space reasons to arrange the capillary channels on the inner surface of the base plate or on another corresponding housing wall. In this case the associated dispensing points should be arranged in the same plane or another plane so as to be accessible from the exterior. In a further embodiment of the invention it is also possible to arrange the dispensing points for capillary networks arranged in different planes in a common filling plane in which case the capillary channels which are separated from the filling plane are connected to their assigned dispensing points via a connecting channel. This structure is of particular use in components in which openings for terminal pins or other housing joints are present both on the underside of the housing as well as on the upper side of the housing.

The housing in accordance with the principles of the present invention is sealed by the method of introducing a pre-determined quantity of sealing compound into the individual dispensing points in accordance with the number and size of the capillary gaps associated therewith. If the capillary gaps which are to be sealed differ considerably from one another in shape and size, it is also possible to introduce sealing compounds to the various dispensing points which differ in viscosity. Moreover, not only may identical resins be used, for example with and without fillers, fixotropic means and other additives, but also different resins with identical or different viscosities may be employed.

DESCRIPTION OF THE DRAWINGS

FIG. 4 is a sectional view of a housing constructed in accordance with the principles of the present invention for use in the method for sealing a component disclosed herein.

FIG. 5 is a plan view of the housing shown in FIG. 4, showing the sectional line IV—IV.

DESCRIPTION OF THE PREFERRED EMBODIMENTS

Figure 1:
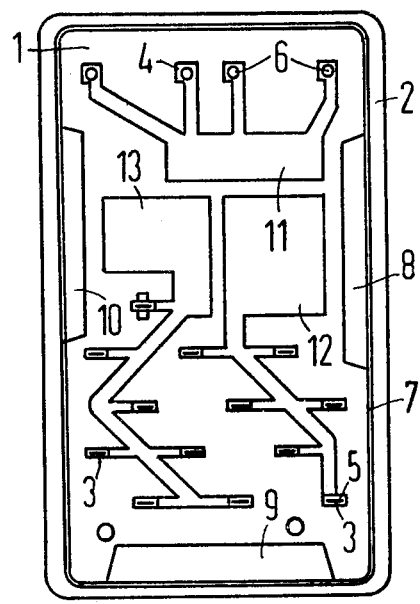
FIG. 1 is a plan view of a first embodiment of a base plate constructed in accordance with the principles of the present invention for use in the method disclosed herein for sealing a component in a housing.

FIG. 1 is a plan view of the connection side of a base plate for a relay constructed in accordance with the principles of the present invention for use with the method disclosed and claimed herein for sealing a component in a housing. The base plate 1 is framed by the edge of a protective cap 2. The base plate 1 has openings 3 and 4 of different geometric shapes through which terminal pins 5 and 6, also of different geometric shape, are passed. In addition, a border gap 7 exists between the base plate 1 and the cap 2. All of the openings and gaps in the region of the base plate are to be sealed with a sealing resin and for production purposes, for example in order not to damage the contact pins, the sealing resin cannot be directly introduced into the gaps which are to be sealed. Instead the sealing resin is introduced at different specific dispensing points and is conducted via a channel system to the points which are to be sealed.

If, in a known manner, all of the points to be sealed were supplied from a central dispensing point, the gaps of very small width, such as the boundary gap 7 between the base plate 1 and the housing cap 2, would, as a result of the strong capillary forces occurring within, draw the sealing resin out of the wider gaps 3 or 4. As a result of additional forces of gravity excess sealing resin in the boundary gap 7 may flow into the interior of the housing whereas various terminal pins would not be effectively sealed.

In order to avoid the above problems in conventional structures the dispensing points 8, 9, 10, 11, 12 and 13 are provided for the capillary gaps 3, 4 and 7 which are each of differing geometric structure. The dispensing points 8, 9 and 10 serve to supply the circular boundary gap 7, the dispensing point 11 supplies the openings 4 for the round terminal pin 6, whereas the contact terminal pins 5 in the openings 3 are sealed from the dispensing points 12 and 13. The terminal pins 5, which are identical to one another and are surrounded by identical capillary gaps 3, could be supplied from a common dispensing point, however, it is preferable to connect a large number of points to be sealed of this type to two or more separate dispensing points. This structure avoids a non-uniform distribution of the sealing resin in the case of capillary gaps which, although identical to one another, may still differ as a result of tolerances.

Figure 2:
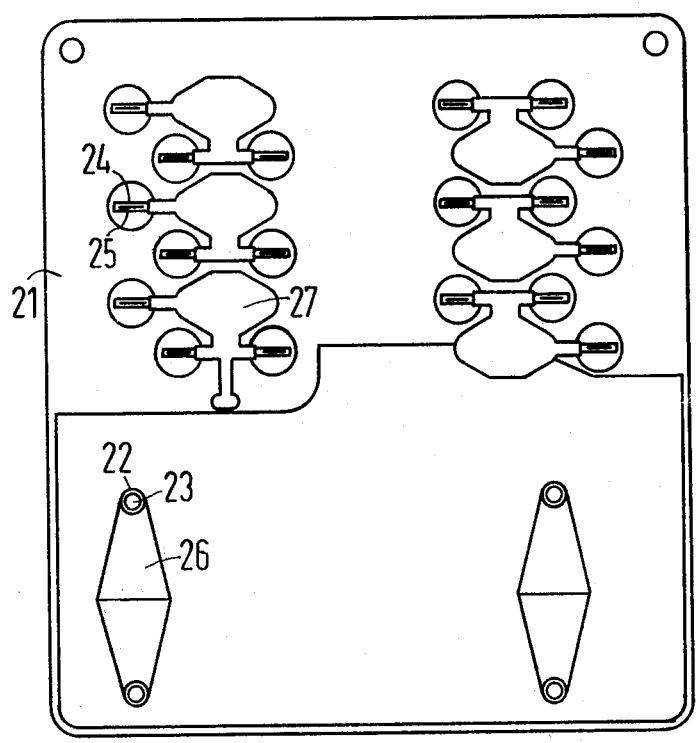
FIG. 2 is a plan view of a second embodiment of a base plate constructed in accordance with the principles of the present invention for use with the method disclosed herein for sealing a component.

A second embodiment of a relay base plate constructed in accordance with the principles of the present invention is shown in FIG. 2. A base plate 21 has, for example, a number of round openings 22 for round terminal pins 23 as well as a number of rectangular openings 24 for blade-like terminal pins 25. Depending upon individual requirements the openings and pins may possess different cross-sections. For the introduction of sealing compound, two round capillary gaps 22 are connected via a dispensing point 26 whereas three terminal openings 24 are supplied via a common dispensing point 27.

Figure 3:
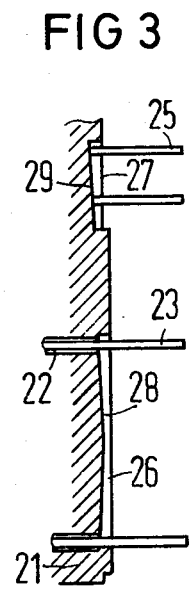
FIG. 3 is a detailed sectional view of a portion of the base plate of FIG. 2.

In order to control and influence the flowing action of the sealing resin in a desired direction, in the present example a slope is provided within the individual dispensing points. This is shown in FIG. 3 which is an enlarged sectional detail from FIG. 2. The dispensing point 26 has a uniform slope 28 from its center to the two connected openings 22 so that the sealing resin is distributed approximately uniformly to the two terminal pins 23. The dispensing point 26 has a highest point approximately midway between the two terminal pins 23 and slopes downwardly therefrom to each pin.

The dispensing point 27 has a slope 29 to one side for the reason that two terminal pins are to be sealed on this side, whereas only one terminal pin 25 is to be sealed on the opposite side thereof. Additionally, the cross-sectional profile of the capillary channels leading from the dispensing points to the gaps which are to be sealed can be designed to vary along the lengths thereof in order to influence the flow behavior of the sealing resin in a pre-determined manner.

A housing 30 which is to be sealed employing the method disclosed herein is shown in section and plan view in FIGS. 4 and 5. The component 30 has a lower housing section 31 and a cover 32 which enclose the interior 33 of the component 30 wherein elements not shown in greater detail are contained. The component 30 has openings 34 for terminal pins 35 in the lower housing section 31 as well as openings 36 in the cover 32 for terminal pins 37.

In order to seal the openings 34 and 36 with sealing resin, dispensing points 38 and 39 are provided and are in a single plane in the cover 32. Sealing compound is introduced by a sealing compound supply and feed means 49 to the dispensing points 38 and 39. From the dispensing point 39 the sealing resin is distributed via channels 40 in the same plane to the terminal pins 37 and seals the openings 36. The dispensing point 38 communicates with a channel 41 in the cover 32 which leads to the lower housing section 31 permitting flow of sealing compound for sealing both the openings 34 and the joint 42 between the lower housing section 31 and the cover 32. A channel network corresponding to the previously-described network can be employed for purposes of distribution in the region of the lower housing section 31. A chamber 44, formed between the edge of the lower housing section 31 and a vertical partition 43, may be filled up to a specific level 45 with sealing compound without exploiting the capillary action.

When the sealing compound is introduced into the dispensing point 38, the compound initially flows through the channel 41 into a feeder chamber 46 and subsequently flows through the opening 47 into the interior of the housing whereupon it is further distributed. In order to facilitate pressure compensation during the sealing process, ventilation openings 48 are provided in the region of the housing joint 42 to permit escape of air from the interior to the exterior of the component 30. During the sealing process, the openings 48 are gradually sealed by the penetrating sealing resin together with the entire joint 42. When all of the openings in the region of the lower housing section 31 have been sealed, the opening 47 is also sealed with sealing compound so that the entire component 30 is sealed. In this manner, the housing openings which are present in a number of planes in the component 30 can all be sealed from a single side with sealing compound.

Although modifications and changes may be suggested by those skilled in the art it is the intention of the inventor to embody within the patent warranted hereon all changes and modifications as reasonably and properly come within the scope of his contribution to the art.

I claim as my invention:

1. An apparatus for sealing an electrical component comprising:

a housing having a housing wall for sealing a hollow inner chamber of said housing;

a plurality of capillary gaps in said housing wall disposed in regions of terminal pins which extend through said housing wall or at a boundary on said housing wall;

at least two dispensing points in said housing wall respectively connected to different ones of said plurality of capillary gaps for reception and distribution of sealing compound introduced to said dispensing points to said capillary gaps via a plurality of interconnecting capillary channels, said dispensing points being respectively connected to capillary gaps and capillary channels of substantially equal capillary characteristics for uniform distribution of said sealing compound to all capillary gaps connected to a dispensing point.

2. The apparatus of claim 1 wherein said dispensing points or said capillary channels have a slope for directing sealing compound toward at least some of said capillary gaps connected thereto.

3. The apparatus of claim 1 wherein said housing is comprised of a baes plate and a housing cover and wherein said dispensing points are disposed on said housing cover.

4. The apparatus of claim 3 wherein said dispensing points are disposed in one plane on said housing cover and wherein at least one of said dispensing points is connected via at least one channel to capillary gaps which are to be sealed which are in at least one different plane.

5. The apparatus of claim 1 wherein each of said dispensing points is supplied with a different volume of sealing compound selected in accordance with the number and dimensions of the capillary gaps connected thereto for completely closing and sealing said capillary gaps.

6. The apparatus of claim 1 wherein sealing compounds having different viscosities are supplied to different dispensing points in accordance with the number and dimensions of the capillary gaps connected thereto for completely closing and sealing said capillary gaps.

7. The apparatus of claim 1 wherein different resins are supplied to different dispensing points in accordance with the number and dimensions of the capillary gaps connected thereto for completely closing and sealing said capillary gaps.

* * * * *